United States Patent [19]

Sato

[11] Patent Number: 4,929,913
[45] Date of Patent: May 29, 1990

[54] GAAS FOCAL PLANE ARRAY READOUT

[75] Inventor: Robert N. Sato, Palos Verdes Estates, Calif.

[73] Assignee: Hughes Aircraft Company, Los Angeles, Calif.

[21] Appl. No.: 393,193

[22] Filed: Aug. 14, 1989

[51] Int. Cl.[5] ............................ H03F 3/08; H03F 3/16
[52] U.S. Cl. .................................... 330/308; 330/253; 330/277
[58] Field of Search ............... 307/353, 540, 557, 562, 307/568; 330/51, 252, 253, 277, 294, 308

[56] References Cited

U.S. PATENT DOCUMENTS

| | | | |
|---|---|---|---|
| 3,808,435 | 4/1974 | Bate et al. | 250/332 |
| 4,004,148 | 1/1977 | Howard et al. | 250/370 |
| 4,335,307 | 6/1982 | DeVries et al. | 250/322 |
| 4,563,656 | 1/1986 | Baum | 330/308 |
| 4,567,363 | 1/1986 | Goodnough | 250/214 A |
| 4,594,562 | 6/1986 | Gurke et al. | 330/307 |
| 4,616,189 | 10/1986 | Pengue, Jr. | 330/253 |
| 4,652,766 | 3/1987 | Wang et al. | 250/578 |
| 4,659,928 | 4/1987 | Tew | 250/332 |
| 4,684,800 | 8/1987 | Morse et al. | 250/211 J |
| 4,709,141 | 11/1987 | Olsen | 250/211 R |
| 4,718,119 | 1/1988 | Salzer et al. | 455/619 |
| 4,743,762 | 5/1988 | Gaaleema et al. | 250/336.1 |
| 4,786,831 | 11/1988 | Morse et al. | 307/490 |
| 4,868,902 | 9/1989 | Sato | 330/253 X |

FOREIGN PATENT DOCUMENTS

WO85/02713 6/1985 World Int. Prop. O. .

OTHER PUBLICATIONS

"Detector Channel Design for a Computerized Tomograph", J. Physics, E. Scientific Instruments, vol. 17, No. 1, Jan. 84, pp. 72-77.
"Active Feedback Lightwave Receivers", Journal of Lightwave Technology, vol. LT-4, No. 10, Oct. 1986, pp. 1502-1508.

Primary Examiner—Steven Mottola
Attorney, Agent, or Firm—William J. Streeter; Wanda K. Denson-Low

[57] ABSTRACT

A capacitive feedback transimpedance amplifier 10 comprises a differential amplifier constructed of GaAs transistor $Q_1$ and $Q_2$ and has an input coupled to the output of an infrared detector 12 and an output expressive of the detector signal integrated over a predetermined interval of time. The amplifier has a transistor $Q_0$ coupled to the input for coupling the input periodically to a predetermined voltage potential and a transistor $Q_9$ coupled to the output of the amplifier for simultaneously periodically coupling the output to a predetermined voltage reference, thereby initializing the amplifier at the beginning of an integration period. A load is coupled between an amplifier output terminal a source of amplifier power. The load includes a resistor having a first terminal coupled to the amplifier output terminal and a second terminal coupled to a first GaAs load transistor. The first load transistor is serially coupled to a second load transistor. A gate terminal of each of the first and the second load transistors is coupled to the amplifier output terminal.

13 Claims, 2 Drawing Sheets

1

GAAS FOCAL PLANE ARRAY READOUT

CROSS REFERENCE TO RELATED PATENT APPLICATION

This patent application is related to copending U.S. Patent Application S.N. 07/151,845, filed Feb. 3, 1988, R. N. Sato, entitled "GaAs Capacitive Feedback Transimpedance Amplifier". This copending patent application is assigned to the assignee of the present patent application.

FIELD OF THE INVENTION

This invention relates to a Gallium Arsenide (GaAs) focal plane array (FPA) readout electronics circuit including a Capacitive feedback Transimpedance Amplifier, also referred to as a CTIA, operated at cryogenic temperatures. In particular, this invention relates to a GaAs CTIA having a novel load structure and other features that result in an improved immunity to process-related variables.

BACKGROUND OF THE INVENTION

FPAs are typically comprised of a two-dimensional array of Infrared (IR) radiation detectors. The individual IR detector elements may be organized in a regular row and column, mosaic-type fashion Such an array of IR detector elements can be comprised of, for example, HgCdTe, InSb, Multiquantum Well Superlattice (MQW SL) material or doped silicon semiconductor material. The IR detector induced signal from each of the IR detector elements is typically coupled to an electronic interface circuit such as a CTIA, a source follower direct readout or a charge coupled device, where each of the signals are integrated over an interval of time and subsequently read out by a suitable multiplexing circuit. Electronic circuits with HgCdTe detector arrays for processing IR induced signals require a significant degree of material compatibility to achieve a long lifetime and reliable operation. Also, interface electronic circuits require low device and circuit noise characteristics for obtaining a satisfactory signal-to-noise ratio. For some applications the circuits must tolerate nuclear radiation in high nuclear radiation environments and also consume low power to achieve both weight and size reduction.

Typically, readout chips are coupled to, or "bumped", with detector arrays at room temperature using indium bump technology. When the chips are rapidly cooled from room temperature to a cryogenic operating temperature stress can build up between the readout circuit and the detector array through the bumping. This stress is most severe if the coefficients of thermal expansion between the materials are different and/or if the chips are large in area. Silicon, the conventional semiconductor material employed for readout circuits, has a poor thermal expansion match with detector materials such as HgCdTe, InSb and GaAs based MQWL SL IR detectors However, other materials such as GaAs are known to have a coefficient of thermal expansion that is closer to that of these detector materials than is the coefficient of expansion of silicon.

It is therefore one object of the invention to provide a GaAs FPA signal processor that exhibits a low power consumption and an improved immunity to nuclear radiation (radiation hardness).

It is a further object of the invention to provide a GaAs FPA signal processor that exhibits low noise when employed in a FPA signal processor It is still one further object of the invention to provide a GaAs FPA signal processor array that has a coefficient of thermal expansion which is closely matched to that of the material of an associated IR detecting array.

Another object of the invention is to provide a GaAs FPA signal processor array that includes a differential pair having an improved load transistor circuit that is substantially insensitive to processing-related variables.

SUMMARY OF THE INVENTION

In accordance with the invention a transimpedance amplifier includes a differential amplifier constructed of GaAs transistors and has an input for coupling to an output of an infrared detector. The amplifier has an output terminal expressive of the detector signal integrated over an interval of time. A load is coupled between the amplifier output terminal and an amplifier power supply. The load includes an implant resistor having a first terminal coupled to the amplifier output terminal and a second terminal coupled to a first GaAs load transistor. The first load transistor is serially coupled to a second GaAs load transistor. A gate terminal of each of the first and the second load transistors is coupled to the amplifier output terminal. This load circuit is shown to beneficially reduce an effect of processing and transistor parameter variations upon the transimpedance amplifier circuit performance.

That is, and in accordance with an aspect of the invention, two transistors $Q_{L2}$ and $Q_{L3}$ and one implant resistor $R_4$ are provided as a load for an amplifier load transistor $Q_{L1}$. An amount of current flowing through $Q_{L2}$ is a function of the magnitude of the resistance of the resistor $R_4$, $R_4$ being connected from the gate terminal to the source terminal of $Q_{L2}$. The amount of current flowing is also a function of the threshold voltage, transconductance, and channel conductance of $Q_{L2}$. Any variation of this threshold voltage transconductance or channel conductance is compensated for by the resistor $R_4$. The gate of $Q_{L3}$ is connected in common with the gate of $Q_{L2}$ to one side of the resistor $R_4$ such that the gate terminal senses the amplifier output voltage variation. $Q_{L3}$ functions as a source follower coupled to the drain of $Q_{L2}$ such that the voltage between the drain and the source of $Q_{L2}$ is forced to maintain a substantially constant voltage level. Thus, both transconductance and channel conductance of $Q_{L2}$ remain substantially constant.

BRIEF DESCRIPTION OF THE DRAWINGS

These and other aspects of the invention will become more apparent herein in the detailed description of the invention taken in conjunction with the accompanying drawings wherein.

DETAILED DESCRIPTION OF THE INVENTION

Figure 1:
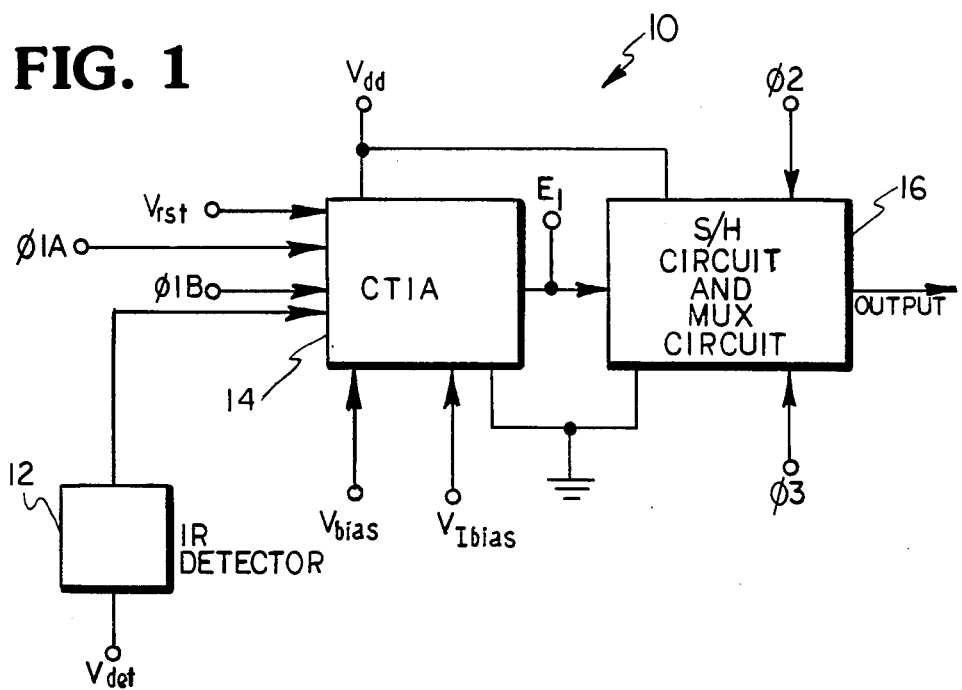
FIG. 1 is a block diagram showing the GaAs readout of the present invention.

Referring now to FIG. 1 there is illustrated in block diagram form a readout unit cell 10. The unit cell 10 is comprised of a CTIA 14 coupled to a photovoltaic p-n or n-p or a photoconductive infrared (IR) detector 12. IR detector 12 is biased to a desired operating point by $V_{det}$ and is coupled to an input of the CTIA 14. The CTIA 14 is controlled by a plurality of clocks, such as integration command clocks $\phi 1A$ and $\phi 1B$. CTIA 14 is also biased by signals $V_{bias}$, $V_{Ibias}$ and $V_{rst}$. The CTIA 14 is powered by a single power supply voltage (Vdd). The IR induced signal which is integrated by CTIA 14 is provided to a Sample and Hold (S/H) and Multiplexer (MUX) circuit 16. S/H and MUX 16 is controlled by clocks ($\phi 2$ and $\phi 3$). The multiplexed output of the S/H 16 is a unit cell sampled analog signal (OUTPUT).

Figure 2:
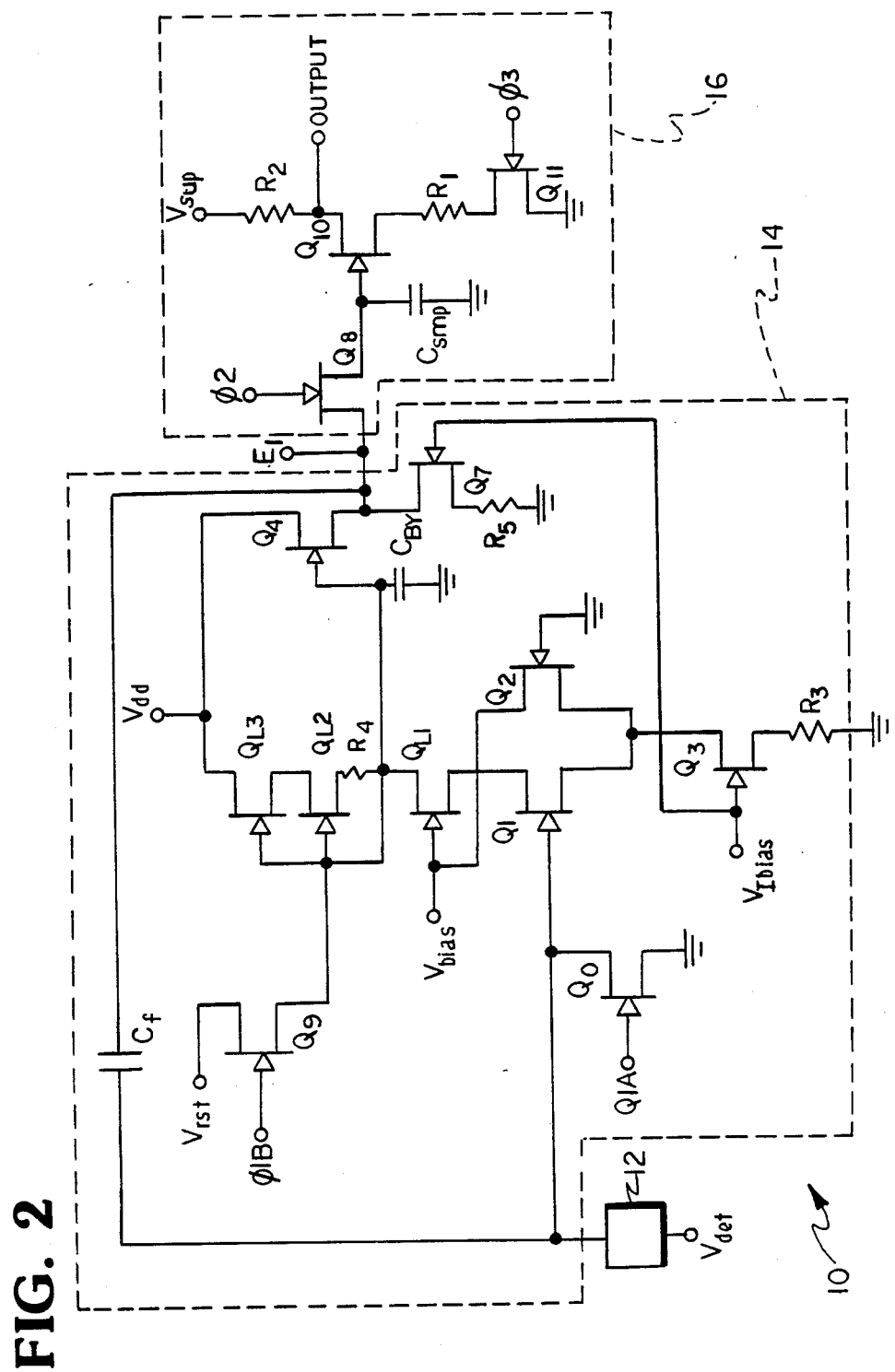
FIG. 2 is a schematic diagram that shows in detail the circuitry of the block diagram of FIG. 1.

Referring now to FIG. 2 there is shown a schematic diagram of a presently preferred embodiment of a FPA signal processor unit cell 10. The unit cell 10 is comprised of 13 GaAs metal-semiconductor field effect transistors (MESFETs), five implant resistors and three capacitors. Switching transistors $Q_0$, $Q_9$ and $Q_{11}$ are enhancement mode devices. A photovoltaic or photoconductive semiconductor radiation detector, which may be an IR detector 12, senses the variation in photon flux within a specified spectral wavelength range and generates a CTIA input signal voltage that is coupled to the gate of $Q_1$. During operation the GaAs CTIA circuit beneficially provides a constant bias voltage feedback signal to the IR detector 12 through a feedback capacitance $C_f$, the feedback signal having a magnitude linearly related to a magnitude of a CTIA 14 output signal appearing at point $E_1$.

CTIA 14 includes a differential amplifier pair $Q_1$ and $Q_2$. In accordance with an aspect of the invention $Q_1$ has a load represented by transistors $Q_{L1}$, $Q_{L2}$, $Q_{L3}$ and a resistive impedance represented by an implant resistor $R_4$. These load devices are serially coupled to a drain terminal of $Q_1$. A source terminal of each of the differential amplifier pair $Q_1$ and $Q_2$ is coupled to the drain of a transistor $Q_3$. $Q_3$ functioning as a current source. A bias voltage signal $V_{Ibias}$ has a magnitude the value of which is selected to provide a desired current flow through $Q_3$ to both $Q_1$ and $Q_2$. Another source of voltage bias, $V_{bias}$, is provided to the gate of load transistor $Q_{L1}$ and to the drain of $Q_2$. The voltage magnitude of $V_{bias}$ establishes the drain voltages of both $Q_1$ and $Q_2$ at a desired level. In that both $Q_1$ and $Q_2$ have substantially identical drain, gate and source voltage levels the devices can be considered to be operated under nearly identical bias conditions, thus ensuring true differential amplifier performance.

In order to realize high-yield production, nonuniformity in chip fabrication must be taken into consideration. Chip fabrication typically causes variations in transistor threshold voltage, transconductance, and channel conductance. In accordance with an aspect of the invention fabrication process variations are compensated for by several different mechanisms. First, $V_{bias}$ compensates for the threshold voltage variation of the differential pair transistors $Q_1$ and $Q_2$. Second, a switching transistor $Q_9$ applies a bias potential $V_{rst}$ to force the CTIA output voltage to a desired initial condition regardless of $Q_{L1}$ transconductance, channel conductance and threshold voltage variations. Third, the CTIA 14 is designed such that the $V_{Ibias}$ voltage provides for a specified low power consumption of the CTIA 14. Finally, the operation of load transistor $Q_{L1}$ is substantially process independent. That is, $Q_{L1}$ is required only to exhibit a relatively low channel conductance because it functions as a source follower. An amount of current flowing through $Q_{L2}$ is a function of the resistance of the implant resistor $R_4$ connected between the gate terminal and the source terminal of $Q_{L2}$ and also of the threshold voltage of $Q_{L2}$. Any variation of this threshold voltage, however, is compensated for by the resistor $R_4$.

The voltage at the gate of $Q_{L2}$ varies according to the amount of the photon-induced signal at the CTIA output due to the fact that $Q_4$ functions as a source follower and the gate of $Q_4$ is connected to the node that includes the drain of $Q_{L1}$. As a result of this voltage variation the source voltage of $Q_{L2}$ varies significantly, but the drain-to-source voltage of $Q_{L2}$ remains substantially constant. If such a drain-to-source voltage variation were to occur the value of both the transconductance and the channel conductance of $Q_{L2}$ would vary, resulting in a nonuniformity in load resistivity. In order to maintain the $Q_{L2}$ drain-to-source voltage at a substantially constant level transistor $Q_{L3}$ is included as a part of the load circuit. The gate of $Q_{L3}$ is connected in common with the gate of $Q_{L2}$ to one side of resistor $R_4$ such that the gate terminal senses the CTIA output voltage variation. $Q_{L3}$ functions as a source follower coupled to the drain of $Q_{L2}$ such that the voltage between the drain and the source of $Q_{L2}$ is forced to maintain a substantially constant voltage level. Both the transconductance and channel conductance of $Q_{L3}$ are not expected to be constant, but the effect of their variation does not have significant effect since the load represented by $Q_{L3}$ as a source follower is a relatively high resistance. $C_{BY}$ functions as a high frequency bypass capacitor for the differential pair output node.

Switching transistors $Q_0$ and $Q_9$, through $Q_4$, turn on to discharge the feedback capacitor, $C_f$, at the beginning of each integration period. Transistor $Q_0$ provides a specified bias voltage across the infrared detector at each integration period. The switching of $Q_9$ is controlled by command clock $\phi 1B$ coupled to the gate thereof, the drain of $Q_9$ being biased by $V_{rst}$. The voltage level of $V_{rst}$ is determined by the polarity of the associated IR detector 12. That is, the signal input to $Q_1$ can be either positive or negative depending on the polarity of $V_{det}$ and whether detector 12 is a p-on-n device or an n-on-p type of device. Transistor $Q_0$ acts as a switch, similar to $Q_9$, and is turned on periodically by clock $\phi 1A$ according to the required integration period When both $Q_9$ and $Q_0$ are turned on, the feedback capacitance $C_f$ is discharged to an initial condition through $Q_0$ to ground and through the source follower $Q_4$ to $V_{rst}$ through $Q_9$. Simultaneously with the discharging of $C_f$, $Q_0$ forces the gate of $Q_1$ to a desired voltage potential, such as ground, to establish a specified potential across the IR detector 12.

The IR detector induced signal is amplified by differential pair $Q_1$ and $Q_2$ in conjunction with $Q_{L1}$, $Q_{L2}$ and $Q_{L3}$ after which the amplified signal is provided to buffer transistor $Q_4$, which is operated in a source follower configuration. Buffer transistor $Q_4$ has coupled to the source terminal thereof the aforementioned feedback capacitor $C_f$. In general, buffer transistor $Q_4$ provides a low-impedance source to the feedback path through $C_f$ and also to the S/H circuit including $Q_8$ and signal storage capacitor $C_{smp}$.

Transistor $Q_7$ functions as a load for the transistor $Q_4$ in conjunction with a resistor $R_5$, the resistor $R_5$ serving to control current flow through $Q_7$ and hence specify power consumption. $V_{bias}$ is coupled to the gate of $Q_7$ for controlling the conduction thereof.

The aforementioned S/H circuit is comprised of a GaAs MESFET switching transistor $Q_8$ and the signal storage capacitor $C_{smp}$. The source-to-drain threshold voltage of $Q_8$ is sufficiently high to prevent the gate from becoming forward biased.

Transistor $Q_{10}$ functions as an amplifier and delivers a sampled analog signal (OUTPUT) to a chip driver (not shown). $Q_{10}$ forms part of the MUX circuit that includes a source resistor $R_1$ and a load resistor $R_2$. $R_1$ and $R_2$ typically have the same resistance value in order to achieve a unity gain feedback amplifier at the MUX output. The particular values of these resistors depends upon the desired multiplexing rate and power consumption. $Q_{10}$ senses the stored charge across the sampling capacitor $C_{smp}$. $Q_{10}$ is activated by the $\phi 3$ clock which is applied to the gate of $Q_{11}$. When $\phi 3$ is applied, $Q_{11}$ is turned on thereby providing current through $R_1$ to the unity gain wideband amplifier $Q_{10}$. The signal OUTPUT has a voltage magnitude substantially equal to the voltage across $C_{smp}$, or the sampled analog signal.

Figure 3:
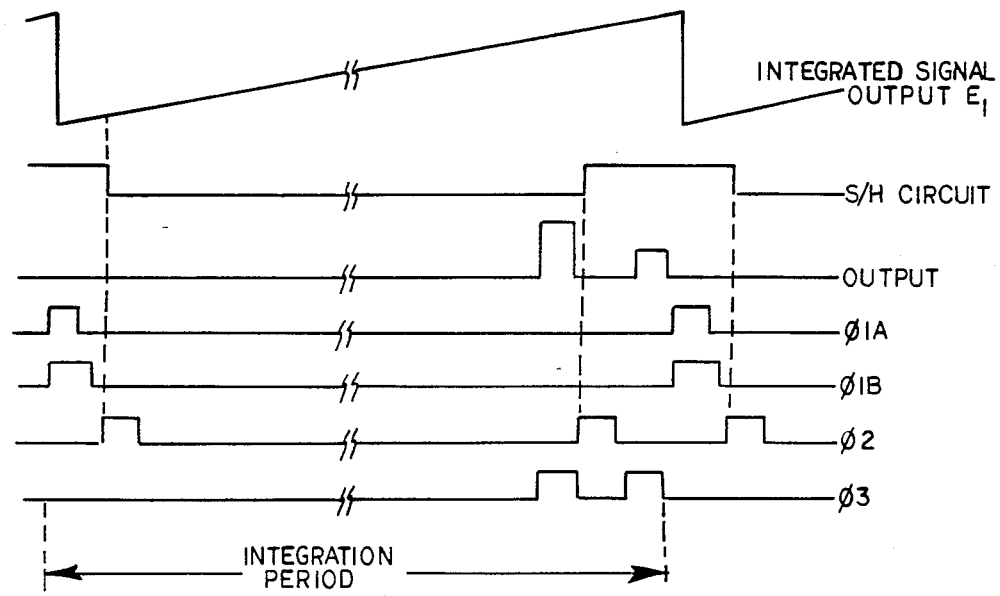
FIG. 3 is a timing diagram that illustrates the operation of the circuitry of FIG. 2.

Referring now to FIG. 3 a timing diagram of a single integration period illustrates, in accordance with a method of the invention, the operation of the circuitry shown in FIG. 3. The signal appearing at the CTIA 14 output, designated $E_1$ in FIGS. 1 and 2, is the integrated IR induced signal. The signal is integrated over an integration period and has an integration slope that is determined by a combination of the detected IR photons, the detector characteristics and the value of the feedback capacitor, $C_f$. The clocks $\phi 1A$ and $\phi 1B$ occur at substantially the same time during the integration period, the $\phi 1B$ signal however, having a slightly longer pulse duration A positive going pulse, $\phi 1A$, turns on transistor $Q_0$ thereby effectively shorting the input of CTIA 14 to circuit ground. This has the effect of discharging the feedback capacitor $C_f$, thereby resetting the feedback capacitor. $\phi 1B$ turns on transistor $Q_9$, thereby establishing the desired potential, $V_{rst}$, at the circuit node that comprises the drain of $Q_{L1}$, the gates of load transist $Q_{L2}$ and $Q_{L3}$ and the gate of buffer transistor $Q_4$. The output of the CTIA 14 is thereby reset to a desired operating voltage potential at the beginning of each integration period by selecting the $V_{rst}$ voltage level.

The clock $\phi 1B$ has a longer duration than that of $\phi 1B$ such that the operating point for the CTIA 14 may be established subsequent to the resetting the CTIA output voltage Shortly after the clock signal $\phi 1B$ is turned off, thereby cutting off transistor $Q_9$ conduction, the $\phi 2$ clock is turned on which causes the voltage across capacitance, $C_{smp}$, to be the same as that of the CTIA buffer output. The $\phi 2$ clock is applied at the beginning of the integration period. The clock $\phi 3$ is applied to read the initial value of the CTIA output signal which is stored by the S/H circuit at the beginning of the integration period. The S/H circuit samples the CTIA output and stores the charge across $C_{smp}$. The $\phi 2$ clock is again applied to the gate of $Q_8$ to sample the final value of the CTIA output before the end of the integration period. Clock $\phi 3$ is once more applied to sense the voltage across $C_{smp}$. Thus, the MUX circuit output provides two sampled analog pulses per integration period, the magnitude of the pulses corresponding to the beginning and end values of the CTIA output. Determining the difference between the two pulses provides for reducing the effect of amplifier noise originating in $Q_1$ and $Q_2$ (1/f noise) and also switching transient noise (kTC noise). Devices $Q_1$, $Q_2$, $Q_{L1}$, $Q_{L2}$, and $Q_{L3}$ are designed to achieve a high open loop amplifier gain. The high gain amplifier in conjunction with feedback capacitor $C_f$ causes the capacitive feedback to dominate, thereby minimizing the effect of any intrinsic capacitance associated with the IR detector 12 and/or any parasitic capacitance associated with the coupling between the detector 12 and the CTIA 14 input. It can be seen that the magnitude of the CTIA output voltage depends only upon the capacitance of the feedback capacitor Cf and the IR detector 12 induced current. As a result, the uniformity of the readout output voltage of the array is excellent.

It should be realized that the FPA readout of the invention, that is an FPA readout using GaAs semiconductor material, has a number of advantages over a FPA readout comprised of Si. As has been stated, the FPA signal processor of the invention has a similar thermal expansion coefficient as that of an associated HgCdTe, InSb, or GaAs based MQW SL IR detector array. Thus, thermal cycling between room and cryogenic temperatures does not induce mechanical stresses. Furthermore, the higher electron mobility of GaAs results in transistors having a transconductance value equivalent to that of silicon transistors but with a substantial reduction in operating power.

The novel load circuitry disclosed herein provides for advantageously rendering the differential amplifier pair substantially immune to process-related and other variations in circuit parameters. The circuitry also sets the operating point of the CTIA amplifier to a desired condition at the beginning of each integration period while also providing for the biasing of the associated IR detector at an optimum operating point.

The invention can be constructed as shown with GaAs MESFETs or with other types of GaAs transistors such as High Electron Mobility Transistors (HEMTs), Selectively Doped Heterostructure Transistors (SDHTs), Modulation Doped Field Effect Transistors (MODFETs), single quantum or double quantum well transistors, or superlattice MESFETs.

Thus, while the invention has been particularly shown and described with respect to a presently preferred embodiment thereof, it will be understood by those skilled in the art that changes in form and details may be made therein without departing from the scope and spirit of the invention.

What is claimed is:

1. A capacitive feedback transimpedance amplifier comprising:
    means, having an input terminal for coupling to an output signal of an infrared detector, for amplifying the detector output signal to produce at an amplifier output terminal an output signal;
    means, coupled between said output terminal and said input terminal, for capacitively feeding back to said input terminal a feedback signal having a magnitude related to a magnitude of said output signal; and
    load means coupled between said amplifier means output terminal and a source of amplifier means power, said load means comprising a resistor having a first terminal coupled to said output terminal and a second terminal coupled to a first load transistor, said first load transistor further being serially coupled to a second load transistor, a control terminal of each of said first and said second load transistors being coupled to said output terminal.

2. A capacitive feedback transimpedance amplifier as defined in claim 1 wherein said means for feeding back comprises:
   a buffer amplifier having a buffer amplifier input terminal coupled to said output terminal, said buffer amplifier further having a buffer amplifier output terminal; and
   a capacitor having a first terminal coupled to said buffer amplifier output terminal and a second terminal coupled to said amplifier input terminal for coupling said feedback signal from said buffer amplifier output terminal to said input terminal.

3. A capacitive feedback transimpedance amplifier as defined in claim 1 wherein said amplifying means comprises:
   a differential amplifier comprising a first and a second GaAs transistor connected in parallel one to another, each of said transistors having a source terminal coupled to an output of a current source means, said first transistor having a gate terminal coupled to said detector output signal, said second transistor having a gate terminal coupled to a circuit ground, said first transistor having a drain terminal coupled to a source terminal of a GaAs load transistor, said load transistor having a drain terminal coupled to said amplifier means output terminal, said load transistor further having a gate terminal coupled to a first source of bias potential and also to a drain terminal of said second transistor.

4. A capacitive feedback transimpedance amplifier as defined in claim 3 wherein said current source means comprises:
   a third GaAs transistor having a source terminal coupled through a resistor to circuit ground, a drain terminal coupled to said source terminals of said first and said second amplifier transistors and a gate terminal coupled to a source of reference current having a predetermined magnitude for setting the current flow through said first and second transistors at a desired operating power.

5. A capacitive feedback transimpedance amplifier as defined in claim 1 and further comprising:
   means for storing a charge signal having a magnitude linearly related to a magnitude of said radiation detector output signal;
   means, coupled between said buffer amplifier output terminal and said storing means, for periodically impressing upon said storing means said charge signal; and
   means, coupled to said storing means, for periodically outputting a voltage signal having a magnitude linearly related to the magnitude of said infrared detector output signal.

6. A capacitive feedback transimpedance amplifier as defined in claim 5 wherein said impressing means comprises a GaAs MESFET transistor having a drain and a source terminal coupled between said buffer amplifier output terminal and said storing means, said GaAs MESFET transistor further having a gate terminal coupled to a clock signal that periodically causes said GaAs MESFET transistor to conduct thereby impressing upon said storing means said buffer amplifier output signal.

7. A capacitive feedback transimpedance amplifier as defined in claim 1 and further comprising:
   means, coupled to said input terminal, for periodically coupling said input terminal to a first predetermined voltage potential; and
   means, coupled to said output terminal, for periodically coupling said output terminal to a second predetermined voltage potential.

8. An infrared detector readout integrated circuit for use at cryogenic temperatures having a plurality of transistor devices comprised of GaAs, said circuit comprising:
   a differential amplifier including a first and a second GaAs amplifier transistor connected in parallel one to another, each having a source terminal coupled to an output of a GaAs current source transistor, said first amplifier transistor having a gate terminal for coupling to an infrared detector output signal, said second amplifier transistor having a gate terminal coupled to a circuit ground, said first amplifier transistor having a drain terminal coupled to a source terminal of a first GaAs load transistor, said first load transistor having a drain terminal coupled to an amplifier output terminal, said first load transistor further having a gate terminal coupled to a first source of bias potential and also to a drain terminal of said second amplifier transistor; and
   load means coupled between said amplifier output terminal and a source of amplifier power, said load means comprising a resistor having a first terminal coupled to said amplifier output terminal and a second terminal coupled to a second GaAs load transistor, said second load transistor further being serially coupled to a third GaAs load transistor, a control terminal of each of said second and said third load transistors being coupled to said amplifier output terminal.

9. A circuit as set forth in claim 8 and further comprising:
   a first GaAs switching transistor coupled between said gate terminal of said first amplifier transistor and a first voltage potential, said first switching transistor including a gate terminal coupled to a first clock signal for periodically resetting a first amplifier transistor gate potential to the first voltage potential; and
   a second GaAs switching transistor coupled between said amplifier output terminal and a second voltage potential, said second switching transistor further having a gate terminal coupled to a second clock signal for periodically resetting an amplifier output potential to the second voltage potential.

10. A circuit as set forth in claim 9 and further comprising:
   a GaAs buffer transistor having an input terminal coupled to said amplifier output terminal, said buffer transistor further having an output terminal;
   a first capacitor having a first terminal coupled to said buffer transistor output terminal, said first capacitor having a second terminal coupled to said gate terminal of said first amplifier transistor for feeding back a signal from said buffer transistor output terminal to said gate terminal of said first amplifier transistor;
   a third GaAs switching transistor having a drain and a source terminal coupled between said buffer amplifier output terminal and a second capacitor, said third switching transistor further having a gate terminal coupled to a third clock signal which periodically causes said third switching transistor to conduct thereby impressing upon said second capacitor said buffer amplifier output signal; and an output GaAs transistor having a gate terminal coupled to said second capacitor and a source terminal coupled to a fourth clock signal for periodically outputting a signal having a magnitude which is a function of a magnitude of the infrared detector output signal.

11. A circuit as set forth in claim 10 wherein said current source transistor has a source terminal coupled to circuit ground, a drain terminal coupled to said source terminals of said first and said second amplifier transistors, and a gate terminal coupled to a source of bias current.

12. A circuit as set forth in claim 11 and further comprising a second GaAs current source transistor having a source terminal coupled to circuit ground and a drain terminal coupled to said output terminal of said buffer transistor, said second current source transistor having a gate terminal coupled to said source of bias current 13. A circuit as set forth in claim 12 wherein said source terminals of each of said first and said second current source transistors are coupled to circuit ground through an associated current limiting resistance.

* * * * *